United States Patent
Cozar et al.

(10) Patent No.: US 6,692,992 B1
(45) Date of Patent: Feb. 17, 2004

(54) HARDENED FE-NI ALLOY FOR THE MANUFACTURE OF INTEGRATED CIRCUIT LEADERFRAMES AND MANUFACTURING PROCESS

(75) Inventors: Ricardo Cozar, La Fermete (FR); Pierre-Louis Reydet, Montigny aux Amognes (FR)

(73) Assignee: Imphy Ugine Precision, Puteaux (FR)

( * ) Notice: Subject to any disclaimer, the term of this patent is extended or adjusted under 35 U.S.C. 154(b) by 0 days.

(21) Appl. No.: 10/296,721

(22) PCT Filed: May 23, 2001

(86) PCT No.: PCT/FR01/01593

§ 371 (c)(1),
(2), (4) Date: Nov. 26, 2002

(87) PCT Pub. No.: WO01/92587

PCT Pub. Date: Dec. 6, 2001

(30) Foreign Application Priority Data

May 23, 2000 (FR) .............................................. 00 06868

(51) Int. Cl.$^7$ ........................ H01L 23/495; H01L 21/44; H01L 21/48
(52) U.S. Cl. ........................ 438/123; 257/672; 257/675; 257/677; 257/666; 257/674; 438/111; 438/121
(58) Field of Search ................................... 257/666, 672, 257/674, 675, 677, 690, 691, 669; 438/123, 111, 121; 148/120, 541, 121

(56) References Cited

U.S. PATENT DOCUMENTS 5,325,911 A    7/1994  Tsuda et al.
5,783,145 A *  7/1998  Coutu et al.

FOREIGN PATENT DOCUMENTS

DE    36 36 815 A1     5/1987
EP       723 030 A1    7/1996
EP     1 063 304 A1   12/2000

OTHER PUBLICATIONS

Patent Abstracts of Japan, vol. 013, No. 595 (C–672), Dec. 27, 1989 & JP 01 252725 (Nippon Steel Corp), Oct. 9, 1989.

Patent Abstracts of Japan, vol. 1996, No. 08, Aug. 30, 1996 & JP 08 100242 (Hitachi Metals Ltd), Apr. 16, 1996.

* cited by examiner

*Primary Examiner*—Long Pham
*Assistant Examiner*—Dilinh Nguyen
(74) *Attorney, Agent, or Firm*—Sughrue Mion, PLLC

(57) ABSTRACT

A method of making a Fe-Ni strip whose chemical composition comprises, by weight: $36\% \leq Ni+Co \leq 43\%$; $0\% \leq Co \leq 3\%$; $0.05\% \leq C \leq 0.4\%$; $0.2\% \leq Cr \leq 1.5\%$; $0.4\% \leq Mo \leq 3\%$; $Cu \leq 3\%$, $Si \leq 0.3\%$, $Mn \leq 0.3\%$; the rest being iron and impurities, the alloy having an elastic limit Rp0.2 more than 750 Mpa and a distributed elongation Ar more than 5%. The alloy is optionally recast under slag. The strip is obtained by hot-rolling above 950° C., then cold-rolling and carrying out a hardening treatment between 450° C. and 850° C., the hardening heat treatment being preceded by a reduction of at least 40%. The invention is useful for making integrated circuit support grids and electronic gun grids.

12 Claims, No Drawings

HARDENED FE-NI ALLOY FOR THE MANUFACTURE OF INTEGRATED CIRCUIT LEADERFRAMES AND MANUFACTURING PROCESS

The present invention relates to a hardened Fe-Ni alloy and to a process for manufacturing it in the form of thin strip that can be especially used for the manufacture of integrated circuit leadframes or of electron gun grids for color display cathode-ray tubes.

In electronic components comprising integrated circuits fabricated from silicon chips, the silicon chips are cemented to leadframes intended especially to form the connection leads of the integrated circuits. These leadframes must be made of an alloy having many properties making them compatible with the silicon chips and allowing satisfactory fabrication of the components. In particular, the alloy must have a thermal expansion coefficient compatible with that of silicon so as to prevent the generation of high mechanical stresses during the thermal cycles involved in the fabrication operations. The alloy must have a mechanical strength sufficient for the connection leads not to deform during handling by means of automatic machines, but it must be sufficiently ductile to allow these leads to be formed by bending. The alloy must also be able to be easily cut, either by chemical cutting or by mechanical cutting, and its surface must not be easily oxidizable in order to allow electroplating to be carried out properly.

Usually, integrated circuit leadframes are made of an N42® alloy which is an Fe—Ni alloy containing about 41% Ni. However, this alloy has the drawback of not having a mechanical strength high enough to produce thin integrated circuit leadframes with a large number of connection leads. This difficulty is especially apparent in the case of integrated circuits called "Quad Flat Packs", the number of connection leads of which may reach 240, or integrated circuits called "Thin Small Outline Packs", the total thickness of which is 1 mm.

To remedy this drawback and to manufacture thin integrated circuits having a large number of connection leads, it has been proposed to use various hardened Fe—Ni alloys, which all have drawbacks.

For example:
- in Japanese patent applications J 04160112, J 04072037 and J 04099252, it has been proposed to use Fe—Ni alloys hardened by solid solution and work-hardening consolidation, but these alloys have a low ductility making them ill-suited for forming by bending;
- in Japanese patent applications J 03207835, J 03207834 and J 03173740, it has been proposed to use Fe—Ni alloys hardened by homogeneous precipitation of either γ' or γ" NiBe phases by the addition of elements such as Be, Ti, Al, Nb or Ta, but these alloys have the drawback of having a reduced cutting speed and a greater sensitivity to surface oxidation compared with those of alloy N42;
- in patent U.S. Pat. No. 5,026,345, it has been proposed to use an Fe—Ni alloy hardened by work-hardening martensite formation, but this alloy has the drawback of having a low ductility and a much higher expansion coefficient than that of N42;
- in patent application EP 0 489 932, it has been proposed to use an F-Ni alloy hardened by precipitation of Ti, Zr, Hf, V, Nb or Ta carbides and by work-hardening consolidation, but this alloy has an increased sensitivity to surface oxidation, thereby degrading the ability to be electroplated.

None of the alloys that have just been mentioned has all the desired properties and it is an object of the present invention to remedy this drawback by providing an alloy with a high yield strength which is better suited to the manufacture of integrated circuit leadframes than the known alloys.

For this purpose, the subject of the invention is a process for manufacturing an Fe—Ni alloy whose chemical composition comprises, by weight:

36%≦Ni+Co ≦43%
0%≦Co≦3%
0.05%≦C≦0.4%
0.2%≦Cr≦1.5%
0.4%≦Mo≦3%
0%≦Cu≦3%
Si≦0.3%
Mn≦0.3%, the balance being iron and impurities, this alloy having a yield strength $R_{p0.2}$ greater than 750 MPa and a uniform elongation $A_r$ greater than 5%. Preferably, the yield strength $R_{p0.2}$ is between 800 MPa and 1100 MPa and the tensile strength $R_m$ is between 900 MPa and 1130 MPa.

Preferably, the chemical composition is such that:
38.5%≦Ni+Co≦41%
0.1%≦C≦0.35%
0.5%≦Cr≦1.2%
1.5%≦Mo≦2.5%.

Also preferably, the uniform elongation $A_r$ is greater than 7%, the yield strength $R_{p0.2}$ is between 800 MPa and 1000 MPa and the tensile strength $R_m$ is between 900 MPa and 1040 MPa.

According to the process for manufacturing the strip:
- an alloy whose chemical composition is in accordance with the composition defined above, is smelted and, optionally, vacuum remelted or electroslag remelted in order to obtain a semifinished product;
- the semifinished product is hot rolled at a temperature greater than or equal to 950° C. in order to obtain a hot strip having a thickness of between 2 and 6 mm, and preferably between 3 and 5 mm, the hot rolling optionally being preceded by a homogenization treatment by a soak above 950° C.; after rolling, the strip is cooled to below 450° C. at a cooling rate sufficient to avoid the precipitation of carbides;
- the hot strip is cold rolled in one or more 5% to 95% thickness reductions separated by anneals at a temperature greater than 950° C.; and
- a hardening heat treatment is carried out between 450° C. and 850° C., the hardening heat treatment being preceded by an at least 40% thickness reduction.

Optionally, after the hardening heat treatment, a supplementary cold-rolling operation is carried out followed by a recovery heat treatment between 550° C. and 750° C.

The invention also relates to strip made of Fe—Ni alloy according to the invention and especially a strip whose thickness is greater than or equal to 0.1 mm and the uniform elongation Ar is greater than or equal to 5%. This strip can be used for the manufacture of an integrated circuit leadframe or for the manufacture of an electron gun grid. It is thus possible to obtain an integrated circuit leadframe made of an alloy whose thermal expansion coefficient between 20° C. and 300° C. is preferably between $4 \times 10^{31}$ $^6$/K and $6 \times 10^{-6}$/K.

The invention will now be described in greater detail and illustrated by examples.

The Fe—Ni alloy forming the subject matter of the invention is an Fe—Ni alloy hardened by precipitation of chromium and molybdenum carbides, the chemical composition of which comprises, by weight:

more than 36%, or better still more than 38.5%, but less than 43%, or better still less than 41%, nickel, it being possible for this element to be partly replaced with cobalt having a maximum content of 3% (the minimum cobalt content may be equal to 0%); the nickel content is chosen so as to obtain a thermal expansion coefficient between 20° C. and any temperature lying between 20° C. and 300° C. of between $3.5 \times 10^{-6}$ and $6.5 \times 10^{31\ 6}$;

more than 0.05%, or better still more than 0.1%, but less than 0.4%, or better still less than 0.35%, carbon so as to allow the formation of recipitation-hardening carbides without impairing the expansion coefficient and the ductility of the alloy;

more than 0.2%, or better still more than 0.5%, but less than 1.5%, or better still less than 1.2%, chromium and more than 0.4% or better still more than 1.5%, but less than 3%, or better still less than 2.5% molybdenum so as to form precipitation-hardening carbides; the Cr+Mo sum is limited to 4.5% in order not to increase the expansion coefficient excessively;

optionally, up to 3% copper (the minimum content being 0% or traces) so as to improve the corrosion resistance and the resistance to oxidation in air, thereby improving the suitability for electroplating;

up to 0.3% silicon and up to 0.3% manganese in order to ensure deoxidation during smelting, the minimum contents of these elements being traces.

The balance of the composition consists of iron and of impurities resulting from the smelting.

The alloy is smelted, for example, in an electric arc furnace with a refining phase followed by a heated-ladle metallurgy step; it may also be smelted in a vacuum induction furnace. Preferably, this smelting must be carried out so as to obtain a high degree of purity, such that the S, P, N and C contents are:

S<0.01% and preferably<0.002%
P<0.02% and preferably<0.008%
N<0.01%
O<0.01%.

The alloy is then cast in the form of a semifinished product, such as a slab, a billet or a remelting electrode. It may also be cast directly in the form of a thin strip having a thickness of less than 15 mm and preferably a thickness of between 8 mm and 12 mm.

When the alloy is cast in the form of a remelting electrode, the latter is vacuum remelted or electroslag remelted so as to obtain a higher purity and more homogeneous semifinished products.

The semifinished product, or the thin strip obtained by direct casting, is hot rolled at a temperature greater than 950° C. and preferably greater than 1050° C., but preferably less than 1300° C., in order to obtain a hot strip whose thickness is between about 2 and 6 mm, preferably between 3 and 5 mm. The rolling temperatures are chosen so as to avoid carbide precipitation and excessive oxidation of the alloy. The thickness of the hot strip is chosen according to the conditions under which cold rolling will be subsequently carried out, so as to be able to make at least one thickness reduction with a reduction ratio of greater than 40% (in particular just before the hardening heat treatment).

The hot rolling may be preceded by a homogenization heat treatment between 950° C. and 1300° C., or better still between 1050° C. and 1200° C. This treatment may last from 30 minutes to 24 hours or more.

After rolling, the hot strip is cooled down to a temperature close to ambient temperature. This cooling must be carried out with a cooling rate between the end-of-rolling temperature, which must remain greater than 950° C., and 450° C., this rate being sufficient to avoid the formation of carbides. It is preferable for the residence time between 950° C. and 450° C. to remain less than 10 minutes and better still less than 5 minutes. The cooling after rolling may be carried out from the rolling heat. The cooling may also consist of rapid quenching carried out after the strip has been heated above 950° C., better still 1050° C., in order for the carbides that possibly have been formed to go back into solution.

The hot strip is then cold rolled in order to obtain a cold strip preferably having a thickness of between 50 µm and 250 µm, and for example between 80 µm and 150 µm. The cold rolling is carried out by a succession of 5% to 95% thickness reductions separated by anneals at a temperature greater than 950° C., or better still 1050° C., in order to avoid the formation of carbides, and preferably less than 1200° C. This annealing is, for example, carried out in a tunnel furnace and lasts from a few seconds to a few minutes.

Furthermore, a hardening heat treatment is carried out on the cold-rolled strip, the treatment consisting in one or more soaks between 450° C. and 850° C., intended harden by the precipitation of chromium and molybdenum carbides; it must be carried out on work-hardened metal with a deformation ratio greater than 40% and may be followed by a supplementary rolling operation. This heat treatment may be carried out either in a static furnace, in which case the soak is preferably carried out between 450° C. and 700° C. for 30 minutes to several hours, or in a tunnel furnace, in which case the soak is preferably carried out above 700° C. for about 10 seconds to 10 minutes.

When the hardening heat treatment is carried out on the strip with the final thickness, the thickness reduction which immediately precedes the hardening heat treatment must be at least 40% and must not be followed by a 950° C. anneal.

When the hardening heat treatment is carried out with a thickness greater than the final thickness, the thickness reduction which immediately precedes the hardening heat treatment must be at least 40% and must not be followed by an anneal above 950° C., and the hardening heat treatment is followed directly by a supplementary cold-rolling operation necessary to obtain the final thickness. This supplementary cold-rolling must not include annealing, but it is followed by a recovery heat treatment at between 550° C. and 750° C., which may last from a few seconds to a few minutes.

Using this process, a cold strip made of an alloy whose yield strength $R_{p0.2}$ is greater than 750 MPa and whose uniform elongation $A_r$ is greater than 5% (the uniform elongation is the elongation which precedes the onset of necking in a tensile test) is obtained. In general, the yield strength $R_{p0.2}$ is between 800 MPa and 1100 MPa and the tensile strength is between 900 MPa and 1130 MPa. Especially in the case of the preferred compositional range, the elongation at break is greater than 7%, in particular when the thickness is greater than or equal to 100 µm (0.1 mm). The yield strength $R_{p0.2}$ may be between 800 MPa and 1000 MPa and the tensile strength between 900 MPa and 1040 MPa.

This alloy has a thermal expansion coefficient between 20° C. and any temperature T lying between 200° C. and 300° C. of between $3.5 \times 10^{-6}$ and $6.5 \times 10^{-6}$. When the nickel content is between 38.5% and 41%, the thermal expansion coefficient is between $4\times10^{-6}$/K and $6\times10^{-6}$/K and it also varies very little between 20° C. and 300° C., this being an advantage in the case of integrated circuit leadframes.

The strip thus obtained may be used to manufacture, by conventional processes known per se by those skilled in the art, integrated circuit leadframes or electron gun grids for color display cathode-ray tubes, for example for televisions. Advantageously, strip with a thickness of between 80 μm and 125 μm, and having an elongation at break greater than 5%, or better still greater than 7%, may be used to manufacture integrated circuit leadframes. Preferably, the composition of the alloy is chosen so that the thermal expansion coefficient varies as little as possible between 20° C. and 300° C., and so that it remains between $4\times10^{-6}$/K and $6\times10^{-6}$/K.

By way of examples, alloys A1 to A12 in accordance with the invention and alloys B, C and D in accordance with the prior art (B corresponds to N42®, C to N42Nb and D to γ'-N42) were smelted.

The chemical compositions of these alloys (in % by weight) are given in Table 1.

Alloys A1, A2 and B were smelted in an arc furnace and alloys A3 to A12, C and D were smelted in a vacuum induction furnace.

The semifinished products were homogenized between 1050° C. and 1200° C. for 2 to 5 hours, then hot rolled above 950° C. and the strips made of alloys A1 to A12 were rapidly quenched from a temperature of 1050° C.

The A1 to A12 alloy strips were cold rolled according to a rolling scheme LA, the A2 alloy was also cold rolled according to a scheme LB.

The LA cold-rolling scheme comprised a succession of thickness reductions separated by recrystallization anneals above 1050° C., the final thickness reduction taking place with a reduction ratio $\tau_1$ greater than 40% and followed by a hardening heat treatment at a temperature $T_1$.

The LB cold-rolling scheme comprised a first part identical to the LA scheme and a second part consisting of a supplementary cold-rolling operation corresponding to a thickness reduction ratio $\tau_2$ followed by a recovery anneal at a temperature $T_2$.

Alloys B and C were rolled according to the usual scheme comprising a succession of thickness reductions separated by recrystallization anneals and terminated by a thickness reduction corresponding to a deformation ratio of greater than 10%. Alloy D was rolled according to a scheme differing from the LA scheme by the deformation ratio before heat treatment, which was 25%, and by a hardening treatment carried out at 750° C. for two minutes in order to cause precipitation hardening by the γ' phase.

In all cases, the final thickness of the strip was between 100 μm and 150 μm (between 0.1 and 0.15 mm).

TABLE 1

| Alloy | Ni | Cr | Mo | Si | Mn | C | S | Others |
|---|---|---|---|---|---|---|---|---|
| A1 | 37.6 | 0.78 | 2.05 | 0.18 | 0.19 | 0.24 | 0.0010 | |
| A2 | 37.9 | 0.80 | 2.07 | 0.17 | 0.19 | 0.24 | 0.0010 | |
| A3 | 38.8 | 0.83 | 2.05 | 0.15 | 0.19 | 0.25 | 0.0009 | |
| A4 | 39.7 | 0.81 | 2.04 | 0.14 | 0.19 | 0.24 | 0.0008 | |
| A5 | 40.8 | 0.80 | 2.03 | 0.14 | 0.19 | 0.23 | 0.0008 | |
| A6 | 41.7 | 0.79 | 2.03 | 0.15 | 0.25 | 0.24 | 0.0008 | |
| A7 | 37.2 | 0.93 | 2.08 | 0.15 | 0.2 | 0.17 | 0.0009 | |
| A8 | 37.5 | 0.82 | 2.09 | 0.15 | 0.2 | 0.29 | 0.0009 | |
| A9 | 37.5 | 0.82 | 1.7 | 0.15 | 0.2 | 0.24 | 0.0009 | |
| A10 | 37.4 | 0.81 | 2.5 | 0.15 | 0.2 | 0.24 | 0.0009 | |
| A11 | 37.6 | 0.66 | 2.09 | 0.15 | 0.2 | 0.24 | 0.0009 | |
| A12 | 37.5 | 0.96 | 2.11 | 0.15 | 0.2 | 0.24 | 0.0009 | |

TABLE 1-continued

| Alloy | Ni | Cr | Mo | Si | Mn | C | S | Others |
|---|---|---|---|---|---|---|---|---|
| B | 40.8 | — | — | 0.1 | 0.45 | 0.002 | 0.0005 | |
| C | 41 | — | — | 0.1 | 0.4 | 0.001 | 0.0005 | Nb:2 |
| D | 41.5 | — | — | 0.1 | 0.4 | 0.001 | 0.0005 | Ti:2.6; Al:2 |

The mechanical properties obtained on the strips made of A2 alloy are given in Table 2.

These results show in particular that, in all cases, the uniform elongation is very much greater than 5%, and even than 7%, while the yield strength is markedly greater than 750 MPa.

The mechanical properties obtained on alloys A1, A7 to A12 and B are given in Table 3.

These results show that with the alloy according to the invention the yield strength is always greater than 750 MPa and the uniform elongation is very much greater than 5%, whereas in alloy B the uniform elongation is greater than 5% only when the yield strength is less than 700 MPa.

TABLE 2

| Scheme | $\tau_1$ (%) | $T_1$ (° C.)/ time (min) | $\tau_2$ (%) | $T_2$ (° C.)/ time (min) | $R_{p0.2}$ (MPa) | $R_m$ (MPa) | $A_r$ (%) |
|---|---|---|---|---|---|---|---|
| LA | 73 | 700/1.4 | | | 1013 | 1090 | 7.9 |
| LA | 73 | 750/1.4 | | | 885 | 994 | 10 |
| LA | 73 | 800/1.4 | | | 766 | 922 | 15 |
| LA | 73 | 700/0.6 | | | 1024 | 1100 | 8.5 |
| LA | 73 | 750/0.6 | | | 870 | 992 | 12 |
| LA | 73 | 750/0.3 | | | 922 | 1028 | 10 |
| LA | 73 | 800/0.6 | | | 778 | 928 | 13 |
| LB | 70 | 700/4 | 60 | 550/1.4 | 1071 | 1152 | 6 |
| LB | 70 | 750/4 | 60 | 650/1.4 | 1058 | 1134 | 7.7 |
| LB | 70 | 800/4 | 60 | 700/1.4 | 1010 | 1114 | 9 |
| LB | 70 | 700/4 | 60 | 550/1.4 | 1054 | 1116 | 7 |
| LB | 70 | 750/4 | 60 | 650/1.4 | 1006 | 1098 | 9.2 |
| LB | 70 | 800/4 | 60 | 700/1.4 | 950 | 1058 | 9.5 |

The mean expansion coefficients $\alpha_{20}^{100}$ between 20° C. and 100° C. and the mean thermal expansion coefficient $\alpha_{20}^{200}$ between 20° C. and 200° C. were also measured. The results are given in Table 4 and Table 5.

These results show, in particular, that the expansion coefficient remains between $3.5\times10^{-6}$/K and $6.5\times10^{6}$/K and that, at least for alloys A3 and A4, the thermal expansion coefficient varies very little over the 20° C./300° C. range.

TABLE 3

| Alloy | $\tau_1$ (%) | $T_1$ (° C.)/ time (h) | $R_{p0.2}$ (MPa) | $R_m$ (MPa) | $A_r$ (%) |
|---|---|---|---|---|---|
| A1 | 75 | 700/3 | 890 | 1016 | 9.5 |
| A1 | 75 | 700/5 | 802 | 961 | 11 |
| A7 | 75 | 625/1 + 700/3 | 798 | 959 | 11 |
| A8 | 75 | 625/1 + 700/3 | 824 | 1018 | 9.5 |
| A9 | 75 | 625/1 + 700/3 | 842 | 1035 | 9 |
| A10 | 75 | 625/1 + 700/3 | 814 | 1048 | 8.5 |
| A11 | 75 | 625/1 + 700/3 | 854 | 1047 | 8.5 |
| A12 | 75 | 625/1 + 700/3 | 830 | 1041 | 9 |
| B | 10 | 460 | 560 | 18 | |
| B | 20 | 580 | 620 | 12 | |
| B | 40 | 680 | 700 | 7 | |
| B | 60 | 740 | 760 | 4 | |
| B | 80 | 820 | 830 | 2 | |

TABLE 4

| Scheme | Alloy | $\tau_1$ (%) | $T_1$ (° C.)/ time (min) | $\tau_2$ (%) | $T_2$ (° C.)/ time (min) | $\alpha_{20}^{100}$ $10^{-6}$/K | $\alpha_{20}^{200}$ $10^{-6}$/K |
|---|---|---|---|---|---|---|---|
| LA | A2 | 70 | 750/4 | | | 3.8 | 4.0 |
| LA | A2 | 70 | 800/4 | | | 3.6 | 3.8 |
| LB | A2 | 70 | 800/4 | 60 | 550/1.4 | 3.2 | 3.5 |
| LB | A2 | 70 | 800/4 | 60 | 550/1.4 | 3.5 | 3.7 |
| LB | A2 | 70 | 800/4 | 60 | 550/1.4 | 3.5 | 3.7 |
| LA | A3 | 78 | 800/5 | | | 4.6 | 4.6 |
| LA | A4 | 70 | 800/5 | | | 5.1 | 5.0 |
| LA | A5 | 75 | 800/5 | | | 5.6 | 5.5 |
| LA | A6 | 70 | 800/5 | | | 6.4 | 6.3 |

TABLE 5

| Scheme | Alloy | $\tau_1$ (%) | $T_1$ (° C.)/ time (h) | $\alpha_{20}^{100}$ | $\alpha_{20}^{200}$ |
|---|---|---|---|---|---|
| LA | A7 | 75 | 625/1 + 700/3 | 3.3 | |
| LA | A8 | 75 | 625/1 + 700/3 | 3.2 | |
| LA | A9 | 75 | 625/1 + 700/3 | 3.3 | |
| LA | A10 | 75 | 625/1 + 700/3 | 3.3 | |
| LA | A11 | 75 | 625/1 + 700/3 | 3.2 | |
| LA | A12 | 75 | 625/1 + 700/3 | 3.4 | |
| usual | B | 25 | | 4.3 | 4.1 |

Measurements of the rate of chemical etching were also made in order to evaluate the suitability for chemical cutting. These tests were carried out by immersing specimens of alloys A2, B and C in an $FeCl_3/6H_2O$:550 g/l+HCl, d=1.18: 10 ml/l acid solution.

These tests showed that, after immersion for 8 minutes, the mean etching rate was about 8.2 µg/min.mm$^2$ in the case of alloy A2 and alloy B, whereas it was only 6.7 µg/min.mm$^2$ in the case of alloy C.

The mechanical cuttability of alloy A2 and alloy B were compared on 0.1 mm thick strips by measuring, on the one hand, the ratio h/t of the mean height (h) of the cup fracture zone to the thickness (t) of the strip and, on the other hand, the deviation σ of this ratio. Alloy A2 was rolled according to the LA scheme with a reduction ratio $\tau_1$ of 73% and a hardening anneal at 750° C. for 0.3 minutes or at 800° C. for 0.3 minutes.

In the case of alloy A2, the h/t ratio is from 0.25 and the deviation σ is from 0.06, whereas in the case of alloy B the h/t ratio varies from 0.22 to 0.31 and the deviation σ is 0.10. Since the h/t ratios are on average comparable, the lower deviation σ of alloy A2 shows that the latter has better mechanical cuttability than alloy B.

Finally, the oxidation sensitivity of alloys A, B, C and D were compared by measuring the thickness of the oxidized surface layer, expressed in nanometers (nm) as a function of the duration of a heat treatment in air at 420° C. in the work-hardened states.

The results given in Table 6 were obtained.

TABLE 6

| Alloy | $\tau_1$ (%) | 1 min. at 420° C. | 3 min. at 420° C. | 10 min. at 420° C. |
|---|---|---|---|---|
| A2 | 72 | 51 | 103 | 188 |
| B | 25 | 102 | 185 | 310 |
| C | 17 | 154 | 218 | 341 |
| D | 20 | 126 | 167 | 241 |

These results show that alloy A2 is less easily oxidizable than the alloys according to the prior art, this being favorable to a good capability of being coated by electrolysis. This capability was confirmed by coating tests in the case of the following coatings; Sn60/Pb40, pre-Ni and complete silver plating, pre-Ni and selective gold plating, pre-Ni and selective silver plating, and selective copper plating and silver plating. In all cases, the results were satisfactory: the thickness was controlled, there were no blisters and the adhesion was good.

All these results show that the alloy according to the invention is more suitable for the manufacture of integrated circuit leadframes than the alloys according to the prior art. Likewise, this alloy is well suited to the manufacture of electron gun grids for cathode-ray tubes. Integrated circuit leadframes and electron guns are articles well known per se.

What is claimed is:

1. A process for manufacturing a strip made of an Fe—Ni alloy having a yield strength $R_{p0.2}$ greater than 750 MPa and a uniform elongation $A_r$ greater than 5%, according to which:

an alloy is smelted whose chemical composition comprises, by weight:
36% ≦ Ni+Co ≦ 43%
0% ≦ Co ≦ 3%
0.05% ≦ C ≦ 0.4%
0.2% ≦ Cr ≦ 1.5%
0.4% ≦ Mo ≦ 3%
Cu ≦ 3%
Si ≦ 0.3%
Mn ≦ 0.3%, the balance being iron and impurities;
alloy is hot rolled at a temperature greater than or equal to 950° C. in order to obtain a hot strip having a thickness of between 2 and 6 mm; after rolling, the strip is cooled to below 450° C. at a cooling rate sufficient to avoid the precipitation of carbides;
the hot strip is cold rolled in one or more 5% to 95% reductions separated by anneals at a temperature greater than 950° C.; and
a hardening heat treatment is carried out between 450° C. and 850° C., the hardening heat treatment being preceded by an at least 40% reduction.

2. The process as claimed in claim 1, characterized in that, after the hardening heat treatment, a supplementary cold-rolling operation is carried out followed by a recovery heat treatment between 550° C. and 750° C.

3. The process as claimed in claim 1, in which the chemical composition of the alloy is such that:
38.5% ≦ Ni+Co ≦ 41%
0.1% ≦ C ≦ 0.35%
0.5% ≦ Cr ≦ 1.2%
1.5% ≦ Mo ≦ 2.5%.

4. A strip obtained by the process as claimed in claim 1, the yield strength $R_{p0.2}$ of which is between 800 MPa and 1100 MPa and the tensile strength $R_m$ of which is between 900 MPa and 1130 MPa.

5. The strip as claimed in claim 4, the yield strength $R_{p0.2}$ of which is between 800 MPa and 1000 MPa, the tensile strength $R_m$ of which is between 900 MPa and 1130 MPa and the uniform elongation of which is greater than 7%.

6. The strip as claimed in claim 4, the thickness of which is greater than 0.1 mm.

7. A method, for the manufacture of an integrated circuit leadframe or for the manufacture of an electron gun grid, using the strip as claimed in claim 4.

8. An integrated circuit leadframe manufactured from a strip as claimed in claim 4, the alloy having a thermal expansion coefficient, between 20° C. and 300° C., of between $4\times10^{-6}$/K and $6\times10^{-6}$/K.

9. An electron gun grid manufactured from a strip as claimed in claim 4.

10. The process as claimed in claim 1, wherein the alloy is hot rolled at a temperature greater than or equal to 950° C. in order to obtain a hot strip having a thickness of between 3 and 5 nm.

11. The process as claimed in claim 1, wherein the hot rolling is preceded by a homogenization treatment by a soak above 950° C.

12. The process as claimed in claim 1, wherein the alloy is vacuum remelted, or electroslag remelted, before being hot rolled, in order to obtain a semifinished product.

* * * * *